(12) United States Patent
Shiraki et al.

(10) Patent No.: US 11,652,467 B2
(45) Date of Patent: May 16, 2023

(54) VIBRATION DEVICE

(71) Applicant: SEIKO EPSON CORPORATION, Tokyo (JP)

(72) Inventors: Manabu Shiraki, Ina (JP); Shinya Aoki, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 240 days.

(21) Appl. No.: 17/083,788

(22) Filed: Oct. 29, 2020

(65) Prior Publication Data

US 2021/0135653 A1 May 6, 2021

(30) Foreign Application Priority Data

Oct. 31, 2019 (JP) .............................. JP2019-198359

(51) Int. Cl.
*H03H 9/19* (2006.01)
*H03H 9/10* (2006.01)
*H03H 9/05* (2006.01)

(52) U.S. Cl.
CPC ............ *H03H 9/19* (2013.01); *H03H 9/0509* (2013.01); *H03H 9/1021* (2013.01)

(58) Field of Classification Search
CPC ....... H03H 9/19; H03H 9/0509; H03H 9/1021
See application file for complete search history.

(56) References Cited

U.S. PATENT DOCUMENTS

2019/0088852 A1\* 3/2019 Mizusawa ............. H01L 41/094

FOREIGN PATENT DOCUMENTS

JP 5-65199 8/1993

\* cited by examiner

*Primary Examiner* — Jeffrey M Shin
(74) *Attorney, Agent, or Firm* — Rankin, Hill & Clark LLP

(57) ABSTRACT

A vibration device has a substrate, a mount disposed on the substrate, a vibration element having a base end and a tip end, the base end being disposed on the mount, and an adhesive fixing the mount and the vibration element. The mount has a first protrusion and a second protrusion disposed to be aligned in a first direction in which the base end and the tip end are aligned, and whose protrusion heights on the vibration element side differ from each other, the second protrusion is located on the base end side of the vibration element relative to the first protrusion, the vibration element is disposed on the first protrusion and the second protrusion, and a portion of the vibration element on the base end side relative to the second protrusion is separated from the substrate and the mount.

10 Claims, 11 Drawing Sheets

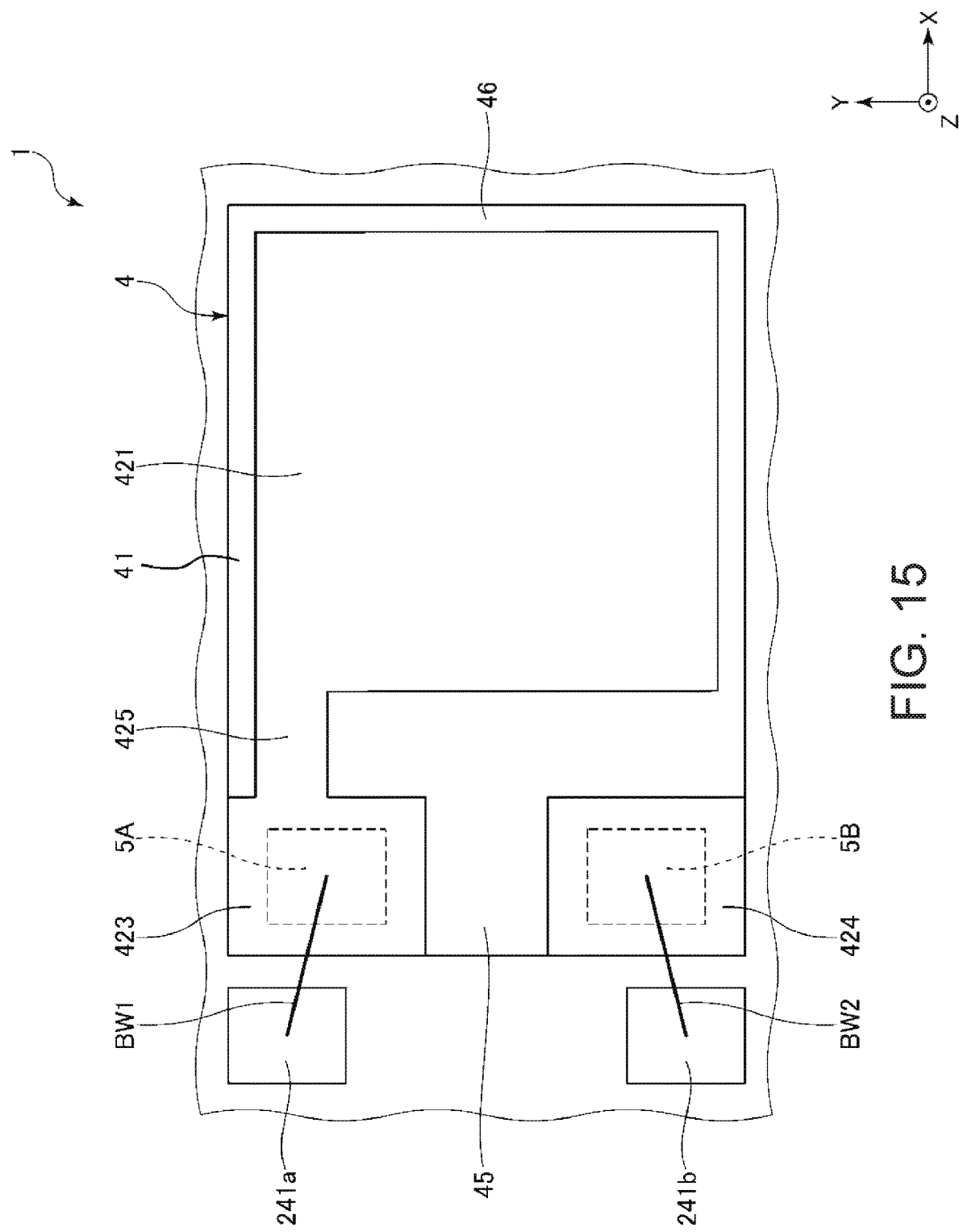

VIBRATION DEVICE

The present application is based on, and claims priority from JP Application Serial Number 2019-198359, filed Oct. 31, 2019, the disclosure of which is hereby incorporated by reference herein in its entirety.

BACKGROUND

1. Technical Field

The present disclosure relates to a vibration device.

2. Related Art

JP-A-5-65199 describes a vibration device having a substrate, an electrode that is disposed on the substrate, and a vibration element that is fixed to the electrode via an adhesive. Also, an upper surface of the electrode has a step, and has a top surface, a bottom surface whose height is lower than the top surface, and a lateral surface that connects the top surface and the bottom surface. The vibration element is disposed such that a lower surface thereof abuts a corner portion where the top surface and the lateral surface intersect and a corner portion of a base end abuts the bottom surface, and is fixed in a posture tilting upward at an angle to the substrate. Thus, a sufficient gap can be secured between a tip end portion of the vibration element and the substrate, and contact therebetween can be inhibited. Note that, hereinafter, the portion of the vibration element contacting the corner portion of the electrode will also be referred to a first contact portion, and the portion contacting the bottom surface will also be referred to a second contact portion.

However, with the vibration device of JP-A-5-65199, when the position of the vibration element relative to the electrode shifts to the base end side or tip end side of the vibration element, the position of the second contact portion shifts in response. In this way, when the position of the second contact portion shifts, the clearance of the first contact portion and the second contact portion varies, and the tilt of the vibration element relative to the substrate changes therewith. Accordingly, with the vibration device of JP-A-5-65199, there is a problem in that miniaturization of the vibration device, particularly a reduction in profile, cannot be achieved, due to being unable to precisely position the vibration element in the height direction.

SUMMARY

According to an aspect of the disclosure, a vibration device has a substrate, a mount disposed on the substrate, a vibration element having a base end and a tip end, the base end being disposed on the mount, and an adhesive fixing the mount and the vibration element, the mount having a first protrusion and a second protrusion disposed to be aligned in a first direction in which the base end and the tip end are aligned, and whose protrusion heights on the vibration element side differ from each other, the second protrusion being located on the base end side of the vibration element relative to the first protrusion, the vibration element being disposed on the first protrusion and the second protrusion, and a portion of the vibration element on the base end side relative to the second protrusion being separated from the substrate and the mount.

In the vibration device according to the present disclosure, the mount may be an electrode electrically connected to the vibration element.

In the vibration device according to the present disclosure, the mount may be constituted by a plurality of layers laminated in a height direction of the first protrusion and the second protrusion.

In the vibration device according to the present disclosure, the first protrusion and the second protrusion may be disposed so as to be separated in the first direction, and the adhesive may be disposed between the first protrusion and the second protrusion.

In the vibration device according to the present disclosure, the first protrusion and the second protrusion may extend in a second direction orthogonal to the first direction in a plan view of the substrate.

BRIEF DESCRIPTION OF THE DRAWINGS

The disclosure will be described with reference to the accompanying drawings, wherein like numbers reference like elements.

FIG. 15 is a plan view showing a supporting substrate provided in a vibration device according to a third embodiment.

DESCRIPTION OF EXEMPLARY EMBODIMENTS

Hereinafter, a vibration device of this application example will be described in detail based on embodiments shown in the accompanying drawings.

First Embodiment

Figure 1:
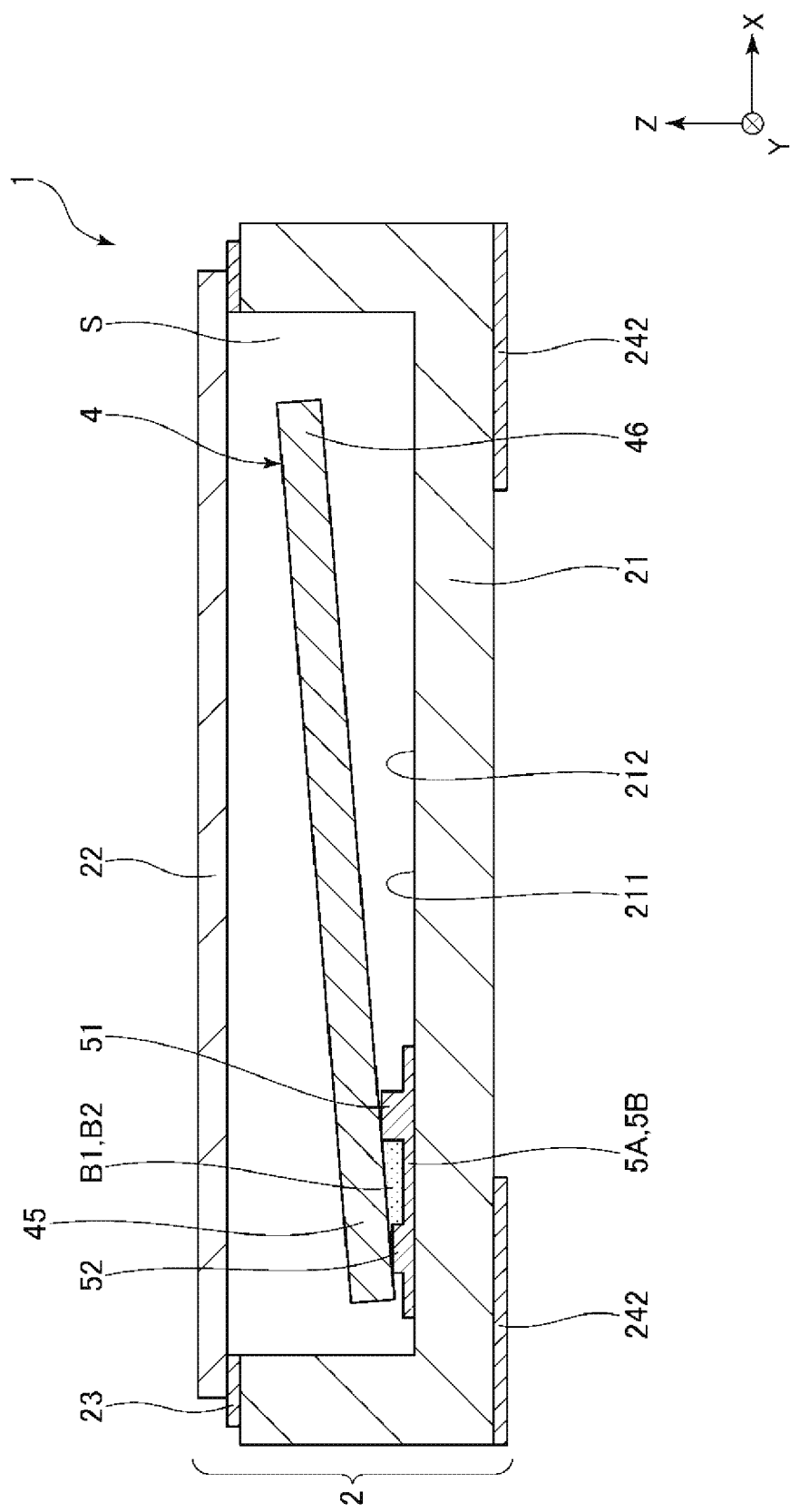
FIG. 1 is a cross-sectional view showing a vibration device according to a first embodiment.
Figure 2:
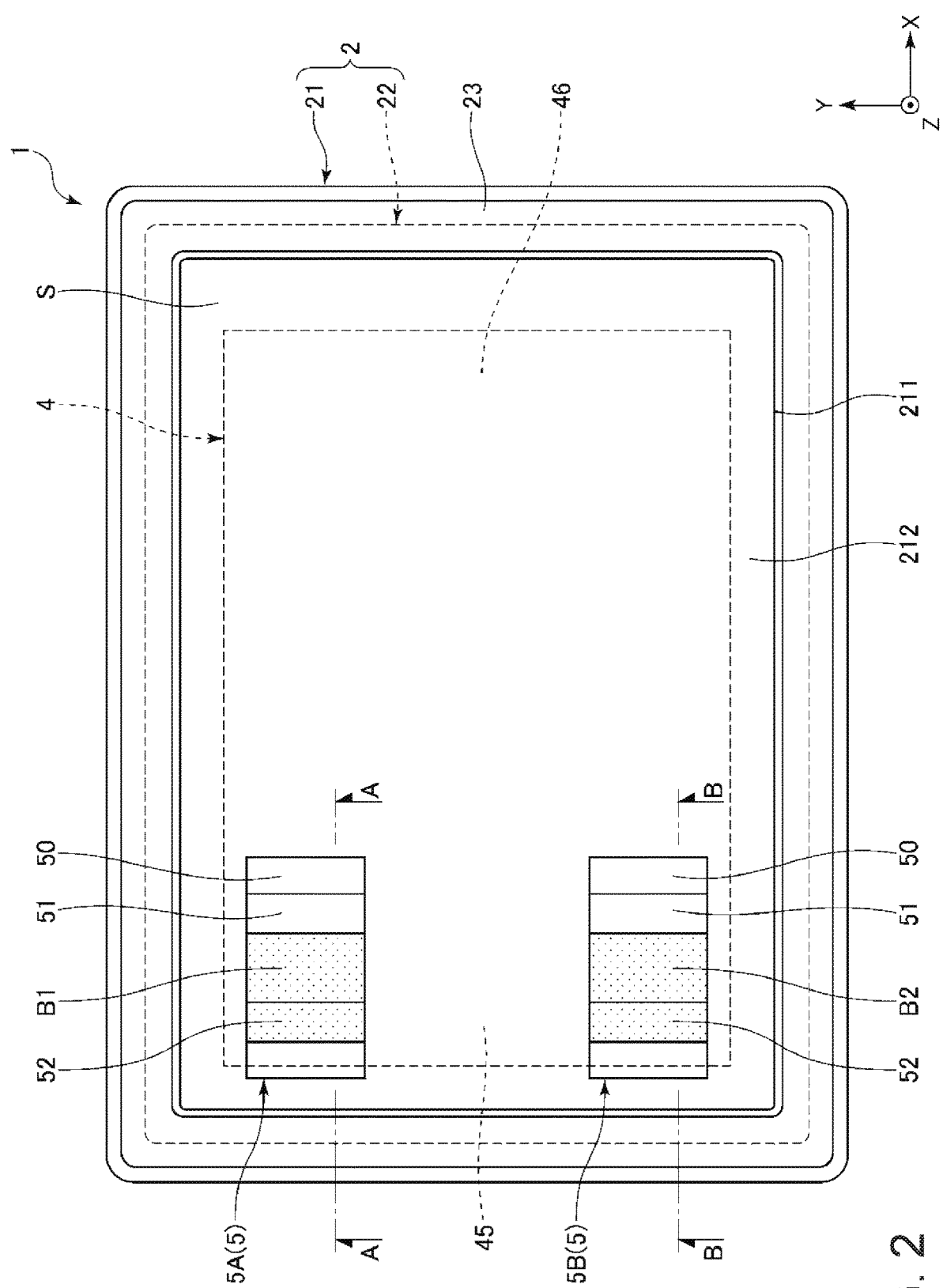
FIG. 2 is a plan view showing the vibration device of FIG. 1.
Figure 3:
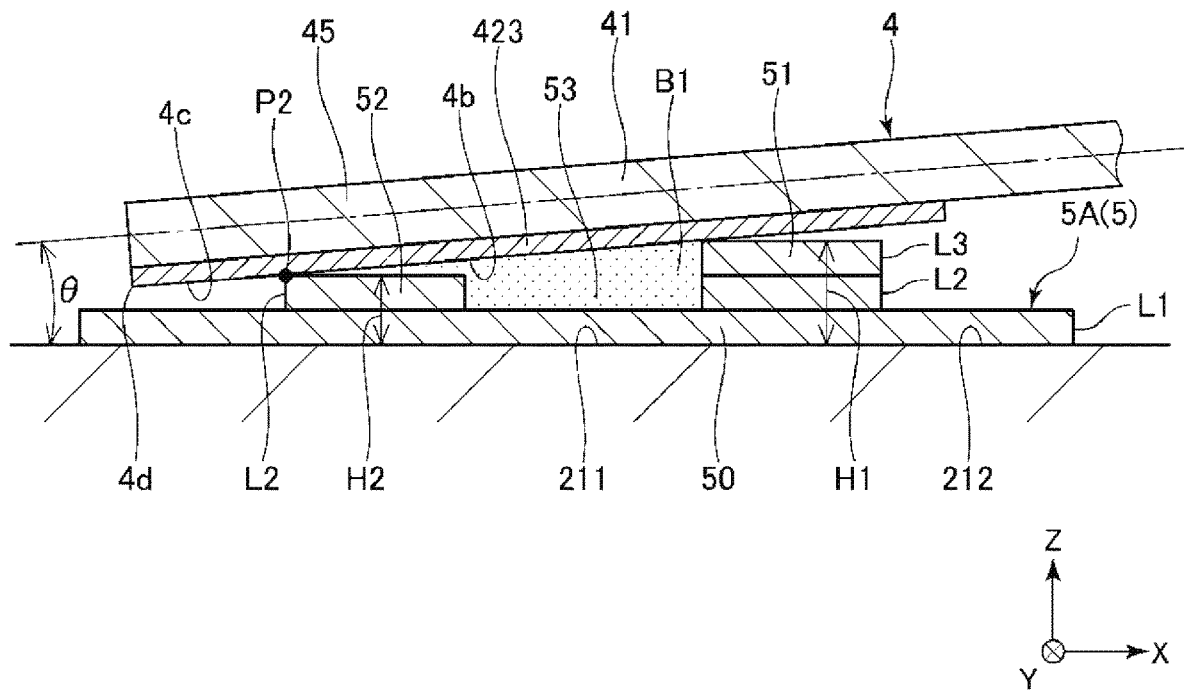
FIG. 3 is a cross-sectional view along line A-A in FIG. 2.
Figure 4:
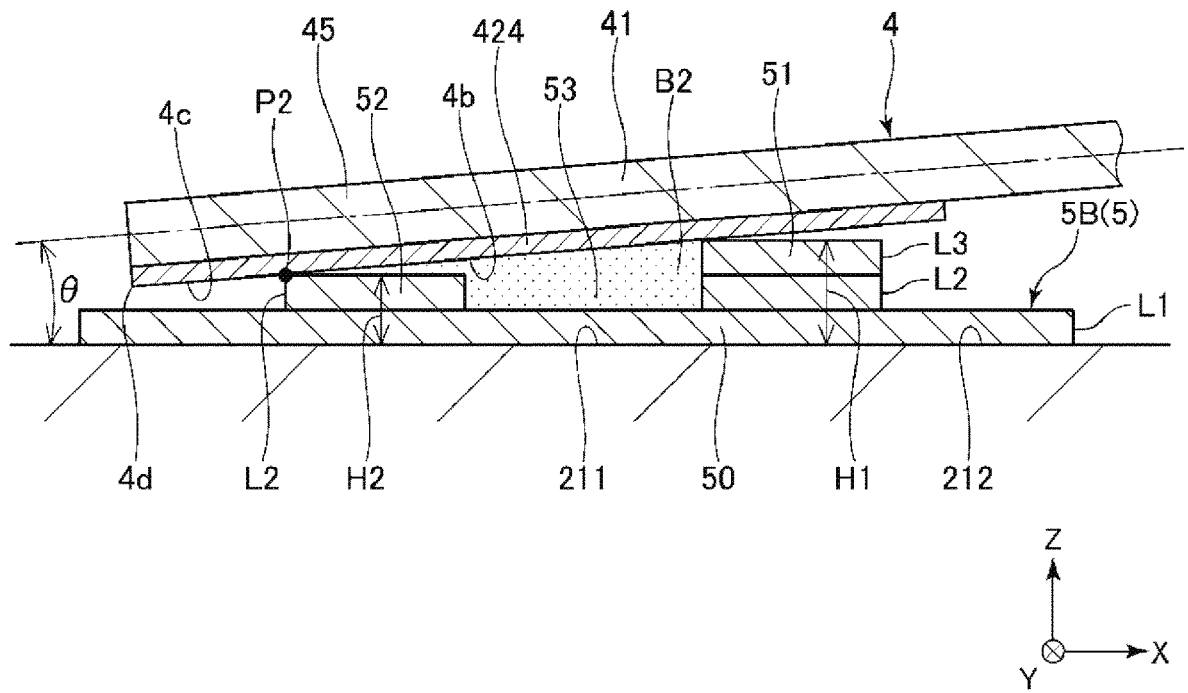
FIG. 4 is a cross-sectional view along line B-B in FIG. 2.
Figure 5:
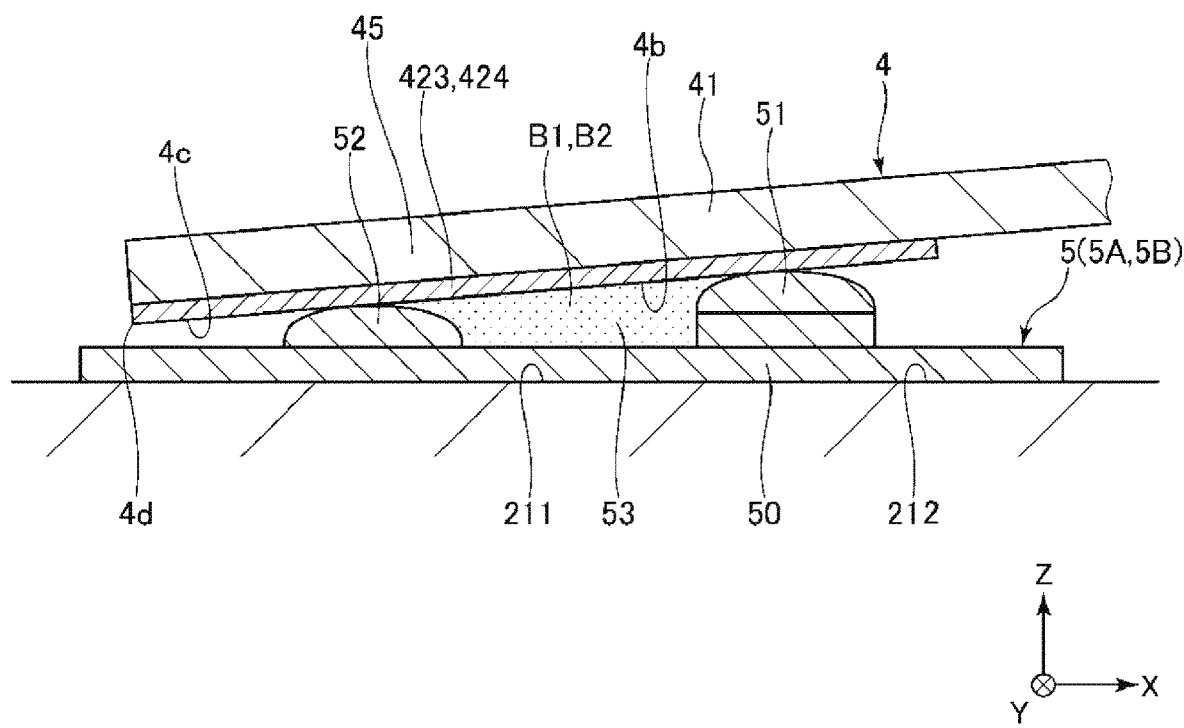
FIG. 5 is a cross-sectional view showing a variation of mounts.
Figure 6:
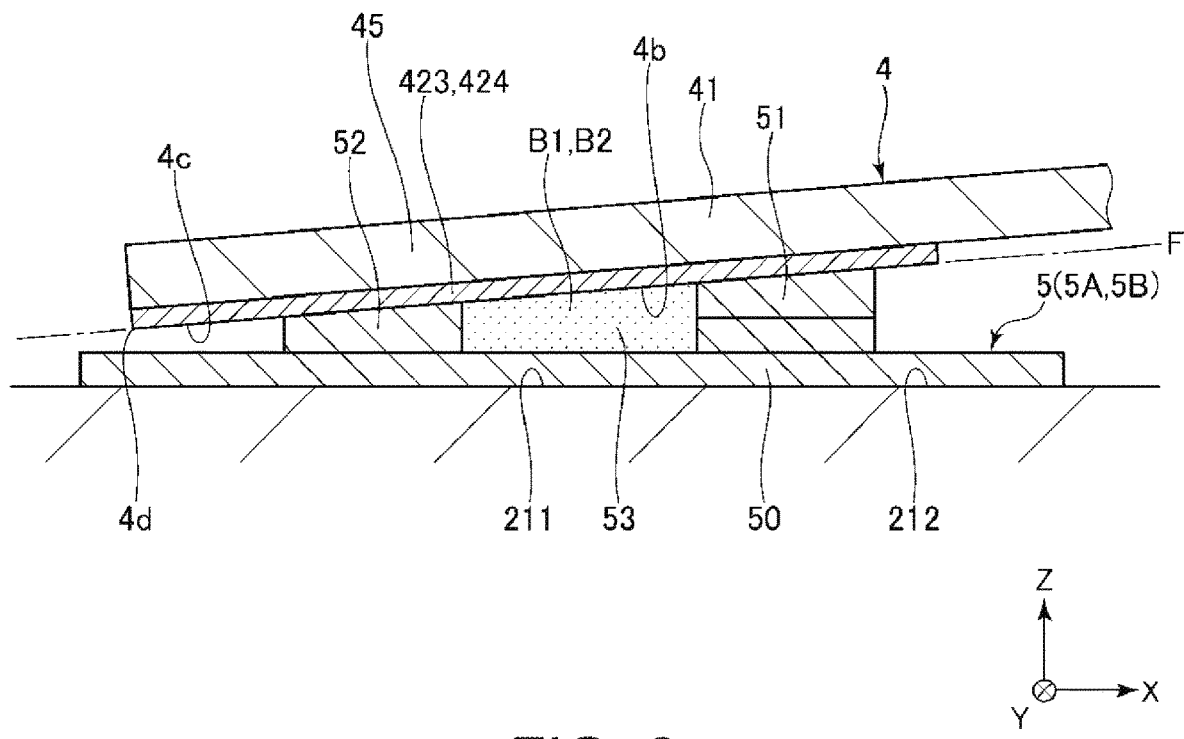
FIG. 6 is a cross-sectional view showing a variation of mounts.
Figure 7:
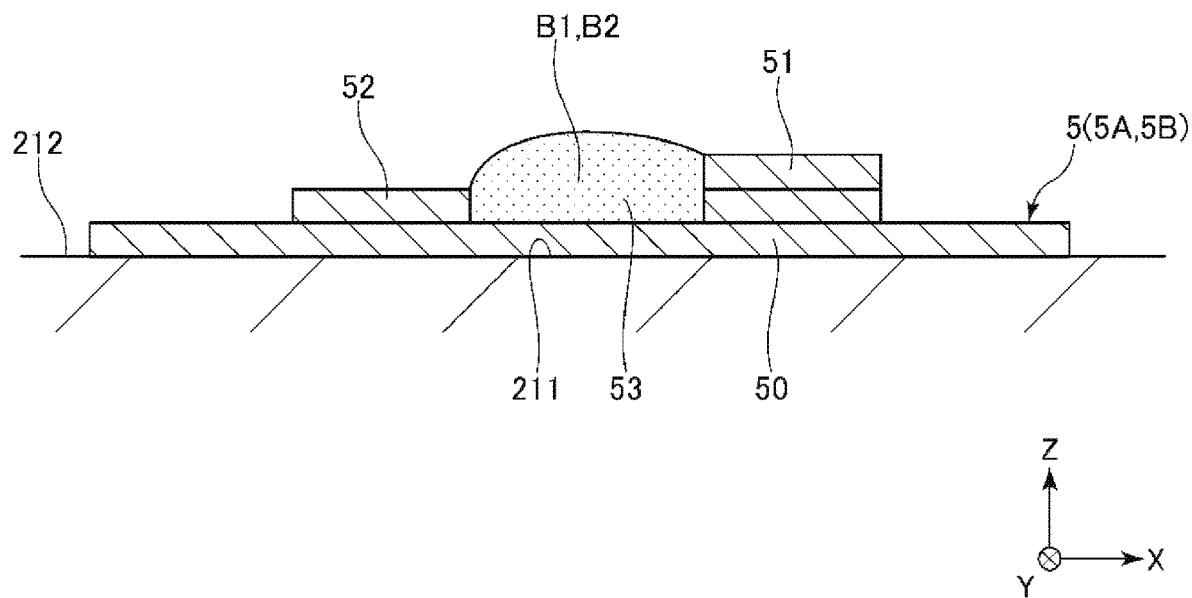
FIG. 7 is a cross-sectional view showing a process of fixing a vibration element to the mounts.
Figure 8:
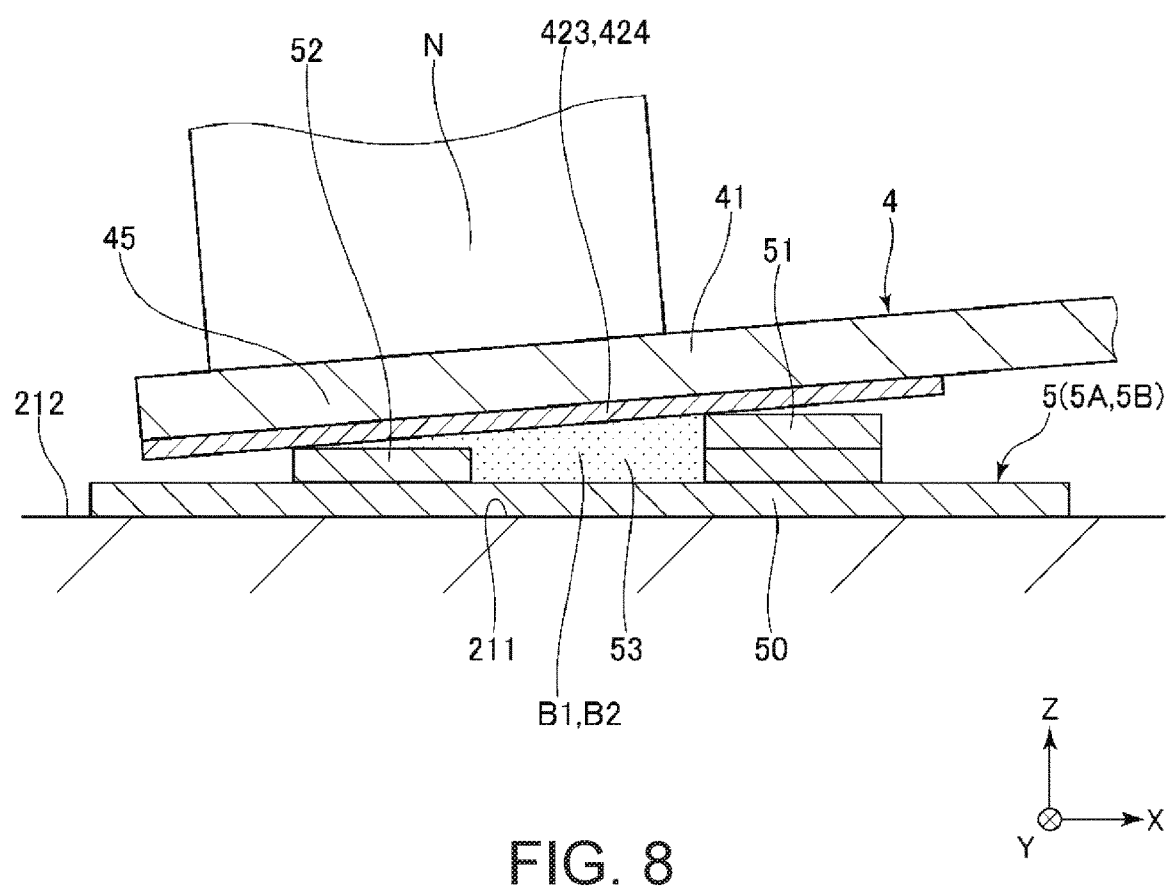
FIG. 8 is a cross-sectional view showing a process of fixing the vibration element to the mounts.
Figure 9:
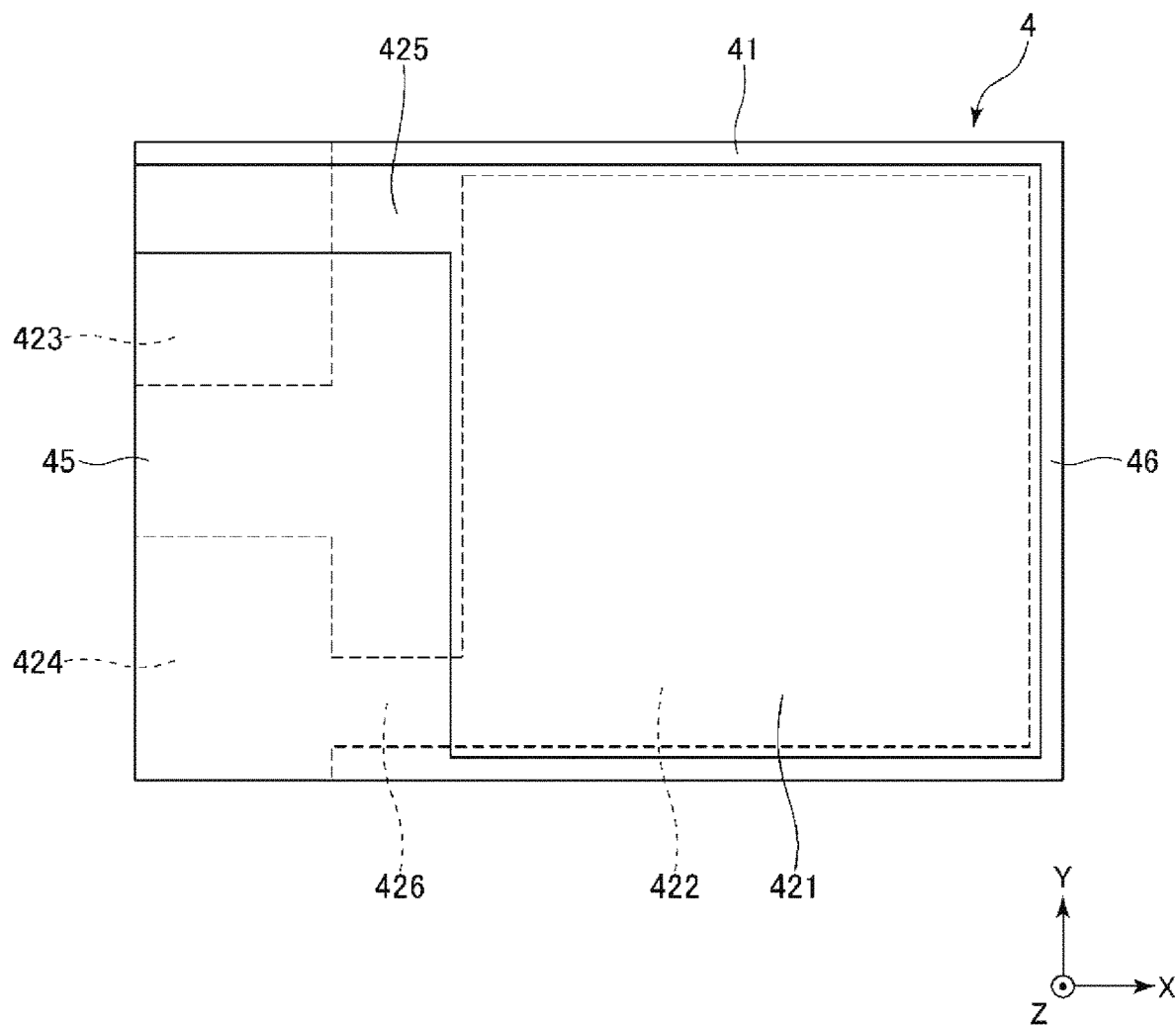
FIG. 9 is a plan view showing the vibration element.
Figure 10:
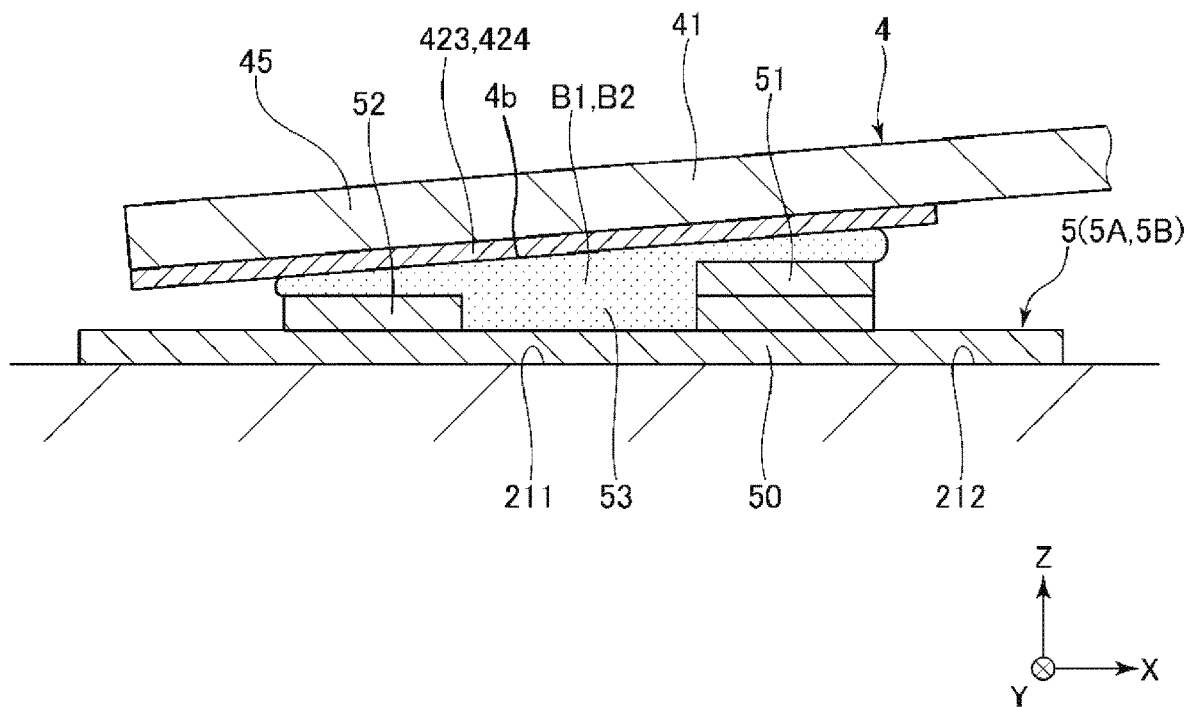
FIG. 10 is a cross-sectional view showing a fixed state of the mounts and the vibration element.
Figure 11:
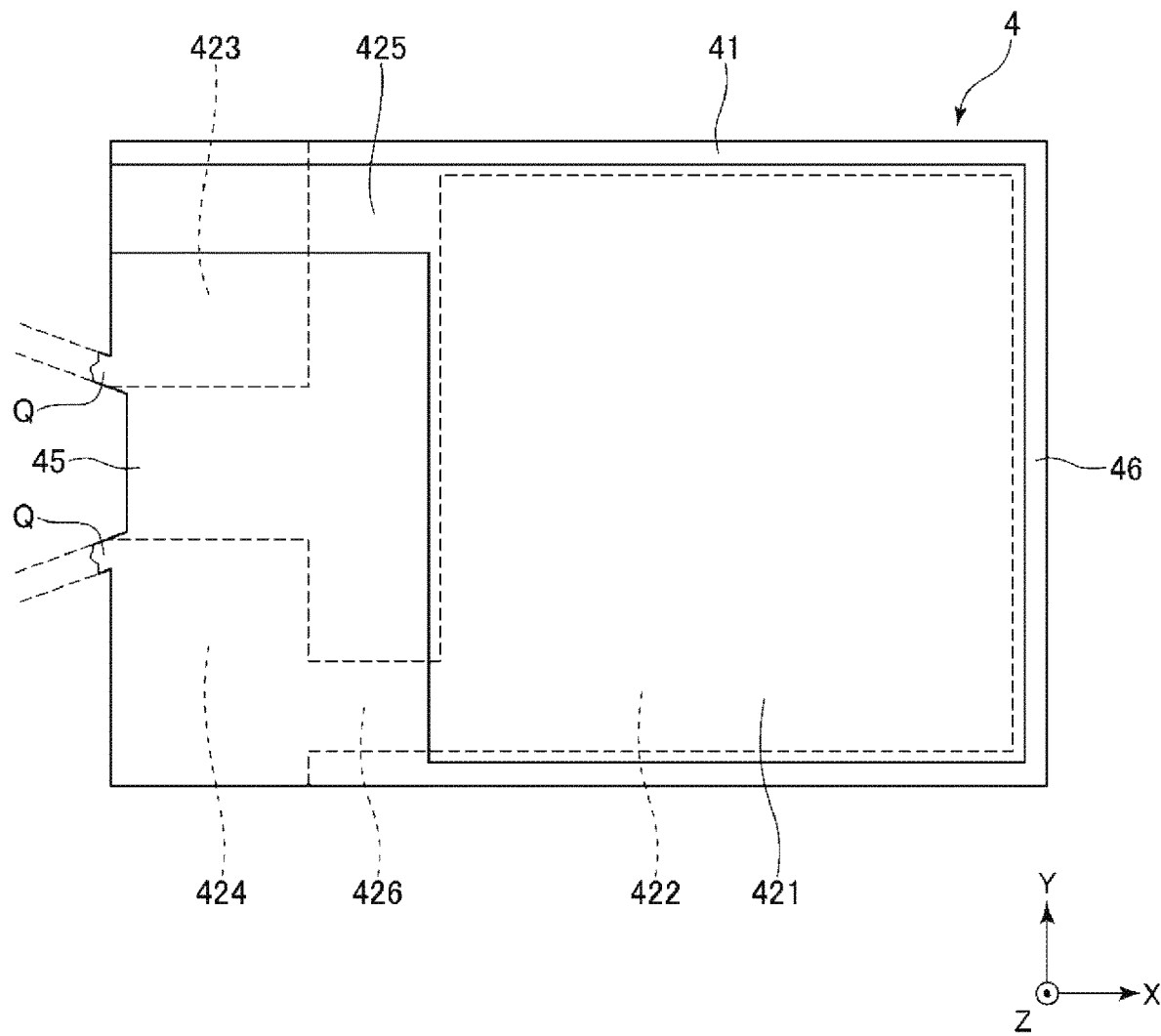
FIG. 11 is a plan view showing another example of the vibration element.

FIG. 1 is a cross-sectional view showing the vibration device according to a first embodiment. FIG. 2 is a plan view showing the vibration device of FIG. 1. FIG. 3 is a cross-sectional view along line A-A in FIG. 2. FIG. 4 is a cross-sectional view along line B-B in FIG. 2. FIGS. 5 and 6 are both cross-sectional views showing variations of mounts. FIGS. 7 and 8 are both cross-sectional views showing a process of fixing a vibration element to the mounts. FIG. 9 is a plan view showing the vibration element. FIG. 10 is a cross-sectional view showing a fixed state of the mounts and the vibration element. FIG. 11 is a plan view showing another example of the vibration element.

Note that, for convenience of description, an X-axis, a Y-axis and a Z-axis, which are three orthogonal axes, are shown in FIGS. 1 to 11. Hereinafter, the tip of the arrow of each axis will also be referred to as the "plus side", and the opposite side will also be referred to as the "minus side". The plus side of the Z-axis will also be referred to as "up" and the minus side will also be referred to as "down". Also, a plan view from a direction along the Z-axis will also be simply referred to as "in plan view".

A vibration device 1 shown in FIG. 1 has a package 2 and a vibration element 4 that is housed in the package 2. Note that the package 2 may, for example, additionally house a circuit element provided with an oscillation circuit that oscillates the vibration element 4 and outputs a predetermined frequency signal, together with the vibration element 4. The vibration device 1 can thereby be used as an oscillator.

The package 2 has a base 21 that is provided with a recessed portion 211 that opens in an upper surface, and a lid 22 that is joined to the upper surface of the base 21 via a joining member 23 so as to close the opening of the recessed portion 211. An internal space S is formed by the recessed portion 211 on the inner side of the package 2, and the vibration element 4 is housed in the internal space S. The base 21, which is a substrate, is constituted by a ceramic such as alumina, for example, and the lid 22, which is a cover, is constituted by a metal material such as kovar, for example. The constituent materials of the base 21 and the lid 22 are, however, not particularly limited.

The internal space S is airtight and in a depressurized state, and may be in a state closely approaching a vacuum. The vibration characteristics of the vibration element 4 are thereby improved. The atmosphere of the internal space S is, however, not particularly limited, and may be, for example, an atmosphere filled with an inert gas such as nitrogen or argon, and may be at atmospheric pressure or in a pressurized state rather than being in a depressurized state.

Also, as shown in FIG. 2, a pair of conductive mounts 5A and 5B are disposed on the bottom surface 212 of the recessed portion 211. The mounts 5A and 5B are disposed on the bottom surface 212 to be aligned in a direction along the Y-axis. A base end portion 45, which is a base end of the vibration element 4, is fixed on the mounts 5A and 5B via conductive adhesives B1 and B2. On the other hand, a tip end portion 46, which is a tip end of the vibration element 4, is not in contact with the base 21 and the lid 22. The vibration element 4 is thereby cantilever-supported at the base end portion 45, with the base end portion 45, which is the end located on the X-axis minus side of the vibration element 4, being the fixed end, and the tip end portion 46, which is the end located in the X-axis plus side, being the free end. The mounts 5A and 5B have a function of controlling the posture, particularly the tilt, of the vibration element 4 relative to the bottom surface 212 of the recessed portion 211.

Also, as shown in FIG. 1, a plurality of external terminals 242 are disposed on a lower surface of the base 21. The mounts 5A and 5B are each electrically connected to a corresponding external terminal 242, via internal wiring (not shown) that is formed within the base 21. The vibration element 4 and the external terminals 242 are thereby electrically connected. In this way, the mounts 5A and 5B function as an electrode that electrically connects the external terminals 242 and the vibration element 4. Miniaturization of the vibration device 1 can thereby be achieved, compared with the case where an electrode is disposed separately to the mounts 5.

Next, the configuration of the mounts 5A and 5B will be described, and given the similarities in configuration, the mounts 5A and 5B will, hereinafter, be collectively described as "mount 5".

As shown in FIGS. 3 and 4, the mount 5 has a base 50 that is disposed on a bottom surface 212 of the recessed portion 211, and a first protrusion 51 and a second protrusion 52 that protrude from the base 50 on the vibration element 4 side, that is, on the Z-axis plus side. The first protrusion 51 and the second protrusion 52 are disposed to be aligned in a direction along the X-axis. More specifically, the second protrusion 52 is disposed on the X-axis minus side of the first protrusion 51, so as to be separated from the first protrusion 51.

A height H1 of the first protrusion 51 from the bottom surface 212 of the recessed portion 211 is higher than a height H2 of the second protrusion 52 from the bottom surface 212 of the recessed portion 211. That is, H1>H2. Thus, a top portion of the first protrusion 51 is located on the Z-axis plus side relative to a top portion of the second protrusion 52. Also, the first protrusion 51 and the second protrusion 52 each have a longitudinal shape extending in a direction along the Y-axis in a plan view seen from a direction along the Z-axis. Also, the first protrusion 51 and the second protrusion 52 are each rectangular in a cross-sectional view seen from a direction along the Y-axis.

The shape of the first protrusion 51 and the second protrusion 52 is, however, not limited thereto. For example, the first protrusion 51 and the second protrusion 52 may have rounded tip end portions, as shown in FIG. 5, or may have sloping tip end surfaces, as shown in FIG. 6. Note that, in the configuration of FIG. 6, the top surface of the first protrusion 51 and the top surface of the second protrusion 52 are located on the same plane F. Also, the shapes of the tip end portions of the first protrusion 51 and the second protrusion 52 may differ from each other.

Such a mount 5 is constituted by a first layer L1 constituting the base 50, a second layer L2 laminated on the first layer L1 and constituting a portion on the base end side of the first protrusion 51 and an entirety of the second protrusion 52, and a third layer L3 laminated on the second layer L2 and constituting a portion on the tip end side of the first protrusion 51. The first layer L1, the second layer L2 and the third layer L3 can be formed in a film formation process by patterning using photolithography, for example. In this way, the mount 5 can be easily formed using a film formation process, by constituting the mount 5 as a laminate. In particular, the heights H1 and H2 of the first protrusion 51 and the second protrusion 52 can be easily set, by selecting the thickness and number of layers constituting the protrusions. That is, the tilt of the vibration element 5 which depends on the difference between the heights H1 and H2 can be easily set.

Note the configuration of the mount 5 is not limited to the above, and may, for example, be formed from a single block-like mass. That is, the base 50 and the first protrusion 51 or the base 50 and the second protrusion 52 may be integrally formed. Note that the constituent material of the first, second and third layers L1, L2 and L3 is not particularly limited as long as the material has conductivity, and various metal materials such as gold (Au), silver (Ag), copper (Cu) and aluminum (Al), for example, can be used.

In this embodiment, the mounts 5A and 5B are constituted by a different material to the base 21, and are adhered to the base 21. In this way, the formation of the mounts 5A and 5B is facilitated by constituting the mounts 5A and 5B from a different material to the base 21. Also, the selectivity of the constituent material of the mounts 5A and 5B is enhanced and design flexibility increases.

As shown in FIGS. 3 and 4, the space between the first protrusion 51 and the second protrusion 52 is utilized as a reservoir 53 for storing the adhesives B1 and B2. The process of fixing the vibration element 4 to the mount 5 involves an application process of applying the uncured adhesives B1 and B2 to the reservoir 53 of the mount 5, as shown in FIG. 7, a disposition process of pushing the vibration element 4 against the mount 5, as shown in FIG. 8, and a curing process of curing the adhesives B1 and B2 by heat curing or UV curing, for example. By providing the reservoir 53, the adhesives B1 and B2 can be effectively inhibited from inadvertently spreading to the base end side or tip end side of the vibration element 4 during the application process and the disposition process. Thus, the join between the vibration element 4 and the adhesives B1 and B2 and the area of the join can be controlled with high precision. Accordingly, the mounts 5A and 5B can be effectively inhibited from short circuiting due to contact of the adhesives B1 and B2, for example. Also, the adhesives B1 and B2 can be effectively inhibited from spreading along the lateral surface of the base end side of the vibration element 4 to the upper surface during the disposition process, where the adhesives B1 and B2 adhere to a nozzle N for suction conveying the vibration element 4, and interfere with the subsequent conveyance of the vibration element 4.

As shown in FIG. 9, the vibration element 4 has a vibration substrate 41 that is constituted by an AT cut quartz crystal substrate, and an electrode disposed on the surface of the vibration substrate 41. The vibration substrate 41 has a thickness shear vibration mode, and has third-order frequency-temperature characteristics. Thus, a vibration element 4 having excellent temperature characteristics is obtained. Also, the outer shape of the vibration substrate 41 is rectangular in plan view. In particular, in this embodiment, the vibration substrate 41 has a rectangular shape with long sides in a direction along the X-axis and short sides in a direction along the Y-axis.

The electrode has a first excitation electrode 421 that is disposed on the upper surface of the vibration substrate 41, and a second excitation electrode 422 that is disposed on a lower surface of the vibration substrate 41, and opposes the first excitation electrode 421 with the vibration substrate 41 sandwiched therebetween. Also, the electrode includes a first terminal 423 and a second terminal 424 that are disposed to be aligned in a direction along the Y-axis on the base end portion of the lower surface of the vibration substrate 41, a first lead-out wiring 425 that connects the first excitation electrode 421 and the first terminal 423, and a second lead-out wiring 426 that connects the second excitation electrode 422 and the second terminal 424.

Note that the configuration of the vibration element 4 is not limited to the abovementioned configuration. For example, the vibration element 4 may be a mesa-type vibration element in which the vibration region sandwiched by the first and second excitation electrodes 421 and 422 protrudes from the periphery thereof, or, conversely, may be a mesa-type vibration element in which the vibration region is recessed from the periphery thereof. Also, bevel processing for grinding the periphery of the vibration substrate 41, or convex processing for making the upper surface and the lower surface into convex surfaces may be performed.

Also, the vibration element 4 is not limited to an element that vibrates in a thickness shear vibration mode, and may, for example, be a tuning fork type vibration element in which two vibrating arms generate tuning fork vibration in an in-plane direction. That is, the vibration substrate 41 is not limited to an AT cut quartz crystal substrate, and may be a quartz crystal substrate other than an AT cut quartz crystal substrate, such as an X cut quartz crystal substrate, a Y cut quartz crystal substrate, a Z cut quartz crystal substrate, a BT cut quartz crystal substrate, an SC cut quartz crystal substrate, or an ST cut quartz crystal substrate, for example. Also, in this embodiment, the vibration substrate 41 is constituted by quartz crystal, but is not limited thereto, and may, for example, be constituted by piezoelectric single quartz crystal such as lithium niobate, lithium tantalate, lithium tetraborate, langasite crystal, potassium niobate and gallium phosphate, or may be constituted by piezoelectric single quartz crystal other than the above. Furthermore, the vibration element 4 is not limited to a piezoelectric drive type vibration element, and may be an electrostatic drive type vibration element that uses electrostatic force.

Such a vibration element 4 is, as shown in FIGS. 2 to 4, disposed on the first and second protrusions 51 and 52, and is fixed to the mounts 5A and 5B by the conductive adhesives B1 and B2. More specifically, as shown in FIG. 3, the adhesive B1 is disposed in the reservoir 53 of the mount 5A and electrically connects the mount 5A and the first terminal 423, as well as fixing the mount 5A and the vibration element 4. Similarly, as shown in FIG. 4, the adhesive B2 is disposed in the reservoir 53 of the mount 5B and electrically connects the mount 5B and the second terminal 424, as well as fixing the mount 5B and the vibration element 4.

Note that the adhesives B1 and B2 are not particularly limited, and a conductive adhesive obtained by dispersing a conductive filler such as a silver filler in various adhesives such as a polyimide adhesive, an epoxy adhesive, a silicone adhesive and an acrylic adhesive, for example, can be used. These adhesives may be curing type adhesives such as heat curing or UV curing adhesives, for example. Also, in the case where the first and second terminals 423 and 424 of the vibration element 4 contact the first and second protrusions 51 and 52, as shown in FIGS. 3 and 4, an electrical connection therebetween is secured in these portions, and thus an insulative adhesive may be used as the adhesives B1 and B2.

In this way, in a state where the vibration element 4 is fixed to the mounts 5A and 5B by the adhesives B1 and B2, a lower surface 4b of the vibration element 4 abuts the first protrusion 51 and the second protrusion 52 of the mounts 5A and 5B, as shown in FIGS. 3 and 4. Here, "abuts" includes the case where the lower surface 4b of the vibration element 4 abuts the first protrusion 51 and the second protrusion 52 via the adhesives B1, and B2, that is, the case where the adhesives B1 and B2 are interposed between the lower surface 4b and the first and second protrusions 51 and 52, as shown in FIG. 10, for example, in addition to the case where the lower surface 4b of the vibration element 4 directly abuts the first protrusion 51 and the second protrusion 52, as shown in FIGS. 3 and 4.

As aforementioned, with the mounts 5A and 5B, the height H1 of the first protrusion 51 is higher than the height H2 of the second protrusion 52, and thus the vibration element 4 is fixed in a posture tilted with respect to the bottom surface 212 of the recessed portion 211, such that the tip end portion 46 will be positioned higher than the base end portion 45, as shown in FIGS. 3 and 4. A sufficient gap can thereby be secured between the tip end portion 46 of the vibration element 4 and the bottom surface 212 of the recessed portion 211, and contact therebetween can be inhibited. In particular, as aforementioned, since the first and second protrusions 51 and 52 have a longitudinal shape that extends in a direction along the Y-axis, the lower surface 4b of the vibration element 4 abuts the first and second protrusions 51 and 52 in a line extending in a direction along the Y-axis. Accordingly, the vibration element 4 can be stably supported by the first and second protrusions 51 and 52, and the posture of the vibration element 4, particularly the posture until the adhesives B1 and B2 have cured, is better stabilized. Accordingly, the posture of the vibration element 4 can be controlled with high precision. Note that the tilt angle θ of the vibration element 4 to the bottom surface 212 of the recessed portion 211 is not particularly limited, and may, for example, be 0°<θ<5°, or may further be 0°<θ<3°.

Also, in a state where the vibration element 4 is fixed to the mounts 5A and 5B by the adhesives B1 and B2, a portion on the base end side relative to the second protrusion 52 of the vibration element 4, or more specifically, a portion 4c on the base end side relative to an abutting portion P2 with the second protrusion 52, is separated from the mount 5 and the bottom surface 212 of the recessed portion 211 throughout an entirety thereof. Thus, a corner portion 4d located at the base end of the vibration element 4 is separated from the mount 5 and the bottom surface 212 of the recessed portion 211. Note that adhesives B1 and B2 that have leaked from the reservoir 53 may fill the space between the portion 4c and the mount 5 or the bottom surface 212 of the recessed portion 211.

According to such a configuration, the tilt of the vibration element 4 does not change even when the fixed position of the vibration element 4 shifts from a target position to the X-axis minus side which is the base end side of the vibration element 4 or the X-axis plus side which is the tip end side of the vibration element 4. This is because the portion 4c is separated from the mount 5 and the bottom surface 212, and thus the state where the vibration element 4 abuts the first and second protrusions 51 and 52 does not change, even when the vibration element 4 shifts in a direction along the X-axis. Accordingly, the position shift of the tip end portion 46 of the vibration element 4 in the height direction will be small when a position shift of the vibration element 4 occurs, compared with a configuration in which the tilt of the vibration element 4 changes, as was the case heretofore. Thus, positioning of the vibration element 4 can be precisely performed, and, therefore, the gap between the vibration element 4 and the lid 22 can be set as small as possible. Thus, miniaturization of the vibration device 1, particularly a reduction in profile, can be achieved. Also, contact between the vibration element 4 and the base 21 or the lid 22 can be inhibited, and a vibration device 1 having high reliability will be obtained.

Also, since the corner portion 4d of the vibration element 4 is separated from the mount 5 and the bottom surface of the recessed portion 211, stress from the base 21 is not readily transferred to the corner portion 4d. Accordingly, failure of the vibration element 4 originating in this corner portion 4d, such as cracking, bending or chipping, for example, can be effectively inhibited. In particular, depending on the configuration of the vibration element 4, protruding portions Q that occur at the base end portion 45 of the vibration element 4 when the vibration element 4 is broken off the quartz crystal wafer may also remain, as shown in FIG. 11. In such cases, particularly failure of the vibration element 4 originating in this corner portion 4d tends to occur when the corner portion 4d is subjected to stress, and thus the effects of this embodiment can be more markedly enjoyed.

Note that although, in FIGS. 3 and 4, a cavity is formed between the portion 4c and the bottom surface 212 of the recessed portion 211, the configuration is not limited thereto as long as the portion 4c and the bottom surface 212 of the recessed portion 211 are separated, and, for example, the cavity between the portion 4c and the bottom surface 212 of the recessed portion 211 may be fill with adhesives B1 and B2 that have leaked from the reservoir 53.

The vibration device 1 is as described above. Such a vibration device 1 has, as aforementioned, a base 21 which is a substrate, mounts 5A and 5B that are disposed on the base 21, a vibration element 4 having a base end portion 45 which is the base end and a tip end portion 46 which is the tip end, and in which the base end portion 45 is disposed on the mounts 5A and 5B, and adhesives B1 and B2 that fix the mounts 5A and 5B and the vibration element 4. Also, the mounts 5A and 5B have a first protrusion 51 and a second protrusion 52 that are disposed to be aligned along the X-axis which is a first direction in which the base end portion 45 and the tip end portion 46 of the vibration element 4 are aligned, and have different protruding heights on the vibration element 4 side, and the second protrusion 52 is located on the base end side of the vibration element 4, that is, on the X-axis minus side, relative to the first protrusion 51. The vibration element 4 is disposed on the first protrusion 51 and the second protrusion 52, and a portion 4c of the vibration element 4 on the base end side relative to the second protrusion 52 is separated from the base 21 and the mounts 5A and 5B. According to such a configuration, the tilt of the vibration element 4 does not change even when the fixed position of the vibration element 4 shifts in a direction along the X-axis. Accordingly, positioning of the vibration element 4 in the height direction can be precisely performed, and, therefore, the gap between the vibration element 4 and the lid 22 can be set as small as possible. Thus, miniaturization of the vibration device 1, particularly a reduction in profile, can be achieved.

Also, as aforementioned, the mounts 5A and 5B are an electrode that is electrically connected to the vibration element 4. Miniaturization of the vibration device 1 can thereby be achieved, compared with the case where the electrode is provided separately to the mounts 5A and 5B.

Also, as aforementioned, the mounts 5A and 5B are constituted by a plurality of layers that are laminated in the height direction of the first protrusion 51 and the second protrusion 52. In particular, in this embodiment, the mounts 5A and 5B are constituted by a laminate of a first layer L1, a second layer L2, and a third layer L3. The mount 5 can thereby be easily formed by a film formation process.

Also, as aforementioned, the first protrusion 51 and the second protrusion 52 are disposed so as to be separated in a direction along the X-axis. Also, the adhesives B1 and B2 are disposed between the first protrusion 51 and the second protrusion 52. The space between the first protrusion 51 and the second protrusion 52 can thereby be utilized as a reservoir 53 for storing the adhesives B1 and B2. Thus, the adhesives B1 and B2 can be inhibited from inadvertently spreading due to the first and second protrusions 51 and 52 acting as stoppers. As a result, the join between the vibration element 4 and the adhesives B1 and B2 and the area of the join can be controlled with high precision.

Also, as aforementioned, the first protrusion 51 and the second protrusion 52 extend in a direction along the Y-axis which is a second direction orthogonal to a direction along the X-axis, in a plan view of the base 21, that is, in a plan view from a direction along the Z-axis. Thus, a lower surface 4b of the vibration element 4 abuts the first and second protrusions 51 and 52 in a line extending in a direction along the Y-axis. Accordingly, the vibration element 4 can be more stably supported by the first and second protrusions 51 and 52, and the posture of the vibration element 4, particularly the posture until the adhesives B1 and B2 have cured, is better stabilized. Accordingly, the posture of the vibration element 4 can be controlled with high precision.

Second Embodiment

Figure 12:
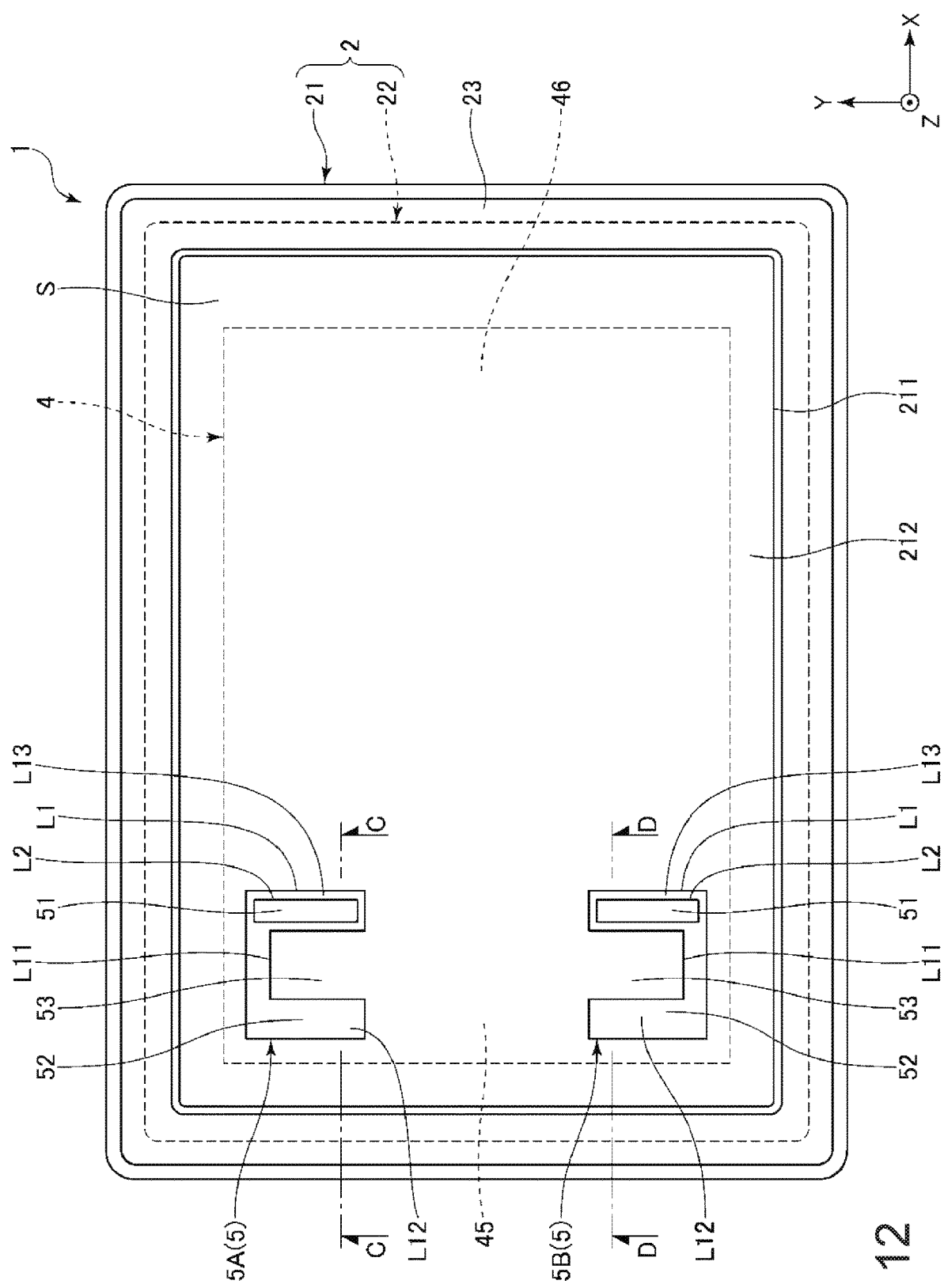
FIG. 12 is a plan view showing mounts provided in a vibration device according to a second embodiment.
Figure 13:
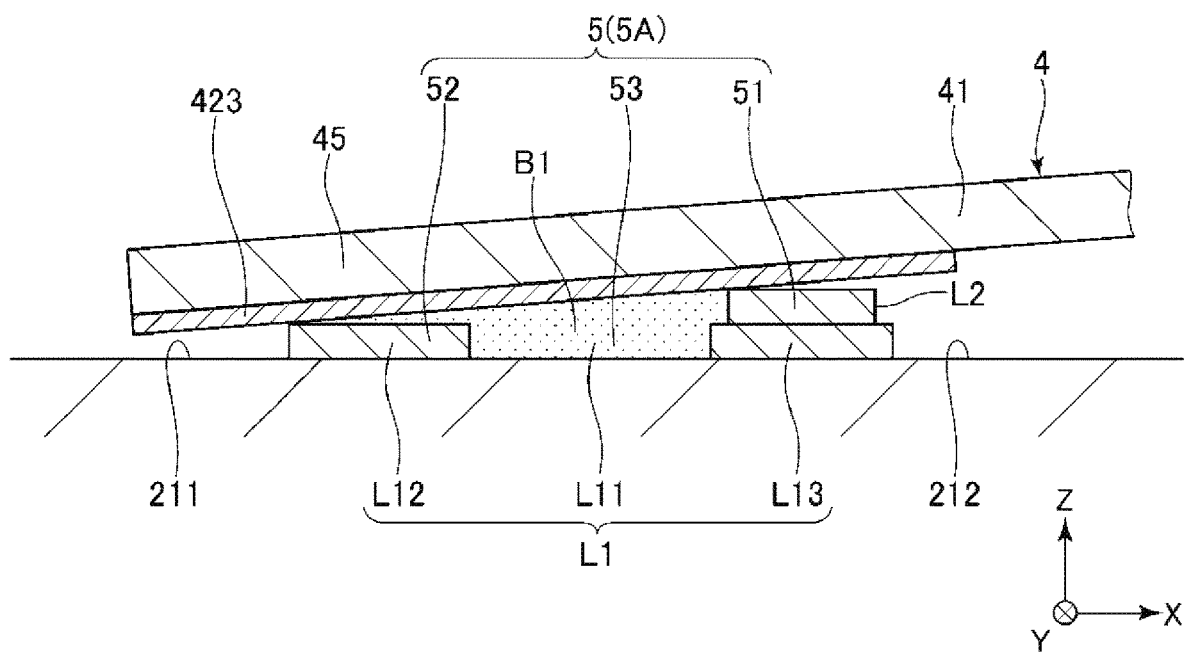
FIG. 13 is a cross-sectional view along line C-C in FIG. 12.
Figure 14:
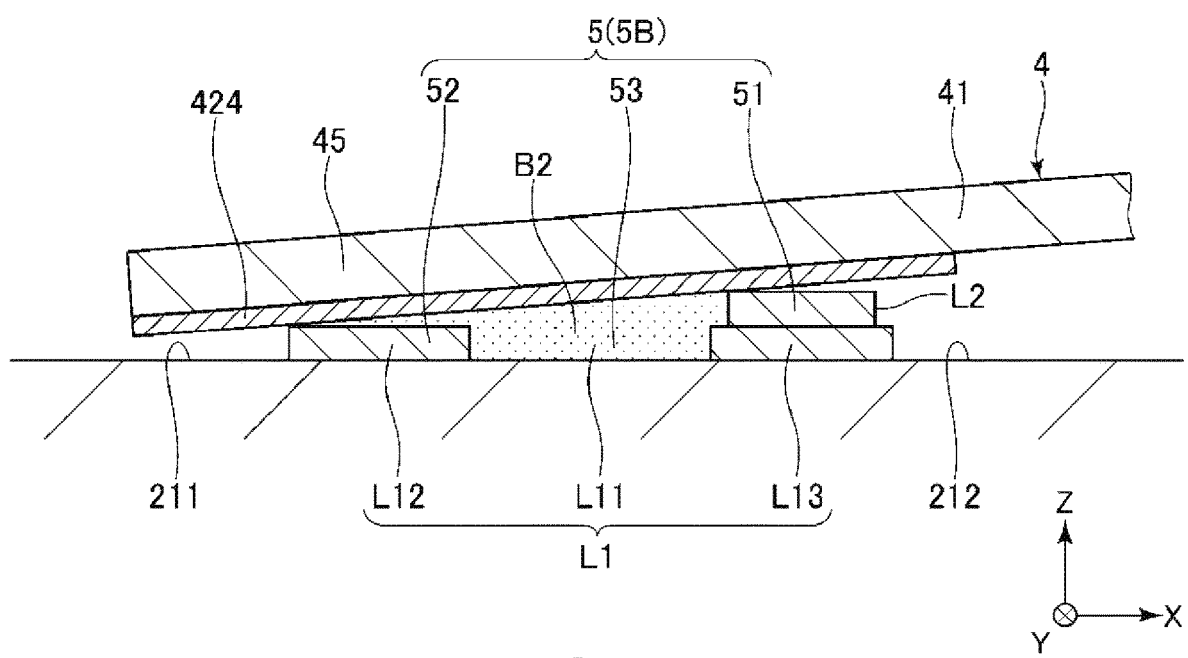
FIG. 14 is a cross-sectional view along line D-D in FIG. 12.

FIG. 12 is a plan view showing mounts provided in a vibration device according to the second embodiment. FIG. 13 is a cross-sectional view along line C-C in FIG. 12. FIG. 14 is a cross-sectional view along line D-D in FIG. 12.

This embodiment is similar to the aforementioned first embodiment, except for configuration of the mounts 5A and 5B being different. Note that, in the following description, this embodiment will be described focusing on the differences from the aforementioned first embodiment, and description of similar matters will be omitted. Also, in FIGS. 12 to 14, constituent elements similar to the aforementioned first embodiment are given the same reference numerals.

As shown in FIGS. 12 to 14, with a vibration device 1 of this embodiment, a mount 5 is constituted by a laminate of a first layer L1 and a second layer L2. The first layer L1 has a cutout L11 extending a direction along the Y-axis in a central portion in a direction along the X-axis, and this cutout constitutes a reservoir 53. Also, a portion L12 that is located on the X-axis minus side relative to the cutout L11 of the first layer L1 constitutes a second protrusion 52, and a portion L13 that is located on the X-axis plus side constitutes a base end portion of a first protrusion 51. The second layer L2 is laminated on the portion L13, and constitutes a tip end portion of the first protrusion 51. According to such a configuration, there are fewer layers constituting the mount 5 compared with the aforementioned first embodiment, and, therefore, formation of the mount is facilitated.

Furthermore, since a bottom surface 212 of a recessed portion 211 is exposed in the reservoir 53, adhesives B1 and B2 can be adhered to the bottom surface 212 of the recessed portion 211. The adhesives B1 and B2 generally exhibit a stronger adhesive strength with ceramic than metal. Thus, for example, the joining strength of the adhesives B1 and B2 can be enhanced, compared with the aforementioned first embodiment, and a vibration device 1 having high mechanical strength is obtained.

Similar effects to the aforementioned first embodiment can also be exhibited according to such a second embodiment.

Third Embodiment

FIG. 15 is a plan view showing a supporting substrate provided in a vibration device according to a third embodiment.

This embodiment is similar to the aforementioned first embodiment, except for the mounts 5A and 5B not additionally serving as an electrode. Note that, in the following description, this embodiment will be described focusing on the differences from the aforementioned first embodiment, and description of similar matters will be omitted. Also, in FIG. 15, constituent elements similar to the aforementioned first embodiment are given the same reference numerals.

As shown in FIG. 15, in a vibration device 1 of this embodiment, internal terminals 241a and 241b serving as an electrode are provided on the bottom surface 212 of the recessed portion 211. Also, in the vibration element 4, first and second terminals 423 and 424 are disposed on an upper surface of the vibration substrate 41. The internal terminal 241a is electrically connected to the first terminal 423 via a bonding wire BW1, and the internal terminal 241b is electrically connected to the second terminal 424 via a bonding wire BW2. Also, these internal terminals 241a and 241b are electrically connected to a corresponding external terminal 242, via internal wiring (not shown) that is formed within a base 21. The vibration element 4 and the external terminals 242 are thereby electrically connected.

In this way, in this embodiment, the internal terminals 241a and 241b which are an electrode are disposed separately to the mounts 5A and 5B, and the mounts 5A and 5B and the adhesives B1 and B2 may have conductivity or insulativity. Thus, the flexibility of the constituent materials of the mounts 5A and 5B and the adhesives B1 and B2 increases. In particular, in this embodiment, the mounts 5A and 5B are constituted by quartz crystal which is insulative. In this way, by constituting the mounts 5A and 5B with the same material as the vibration substrate 41 of the vibration element 4, the coefficients of linear expansion thereof can be equalized. Thus, stress caused by a difference in the coefficients of linear expansion tends not to occur in the vibration element 4, and the vibration characteristics of the vibration element 4 improve. Note that the constituent material of the mounts 5A and 5B is not particularly limited, and, for example, various ceramics and various resin materials can also be used.

Similar effects to the aforementioned first embodiment can also be exhibited according to such a third embodiment.

Although a vibration device of the present disclosure has been described above based on illustrated embodiments, the disclosure is not particularly limited thereto, and the configurations of the constituent elements can be replaced by elements of any configuration having similar functions. Any other suitable constituent elements may also be added to the disclosure. Also, the embodiments may be combined as appropriate.

Also, in the aforementioned embodiment, the height H1 of the first protrusion 51 is greater than the height H2 of the second protrusion 52, that is, H1>H2, but the disclosure is not limited thereto, and H1<H2 is possible. In this case, the vibration element 4 is fixed in a posture tilted relative to the bottom surface 212 of the recessed portion 211, such that the tip end portion 46 will be positioned lower than the base end portion 45. Similar effects to the aforementioned embodiment can also be exhibited according to such a configuration.

What is claimed is:
1. A vibration device comprising:
a substrate;
a mount disposed on the substrate;
a vibration element having a base end and a tip end, the base end being disposed on the mount; and
an adhesive fixing the mount and the vibration element, wherein the mount has a first protrusion and a second protrusion disposed to be aligned in a first direction in which the base end and the tip end are aligned, and whose protrusion heights on the vibration element side differ from each other,
the second protrusion is located on the base end side of the vibration element relative to the first protrusion, the vibration element is disposed on the first protrusion and the second protrusion, a portion of the vibration element on the base end side relative to the second protrusion is separated from the substrate and the mount, and the mount, including the first protrusion and the second protrusion, is formed of a metal having conductivity, and the mount, including the first protrusion and the second protrusion, is an electrode electrically connected to the vibration element.

2. The vibration device according to claim 1,
wherein the mount is constituted by a plurality of metal layers laminated on the substrate in a height direction of the first protrusion and the second protrusion, the first protrusion being formed of a greater number of metal layers than the second protrusion.

3. The vibration device according to claim 1,
wherein the first protrusion and the second protrusion are disposed so as to be separated in the first direction, and
the adhesive is disposed between the first protrusion and the second protrusion.

4. The vibration device according to claim 1,
wherein the first protrusion and the second protrusion extend in a second direction orthogonal to the first direction in a plan view of the substrate.

5. The vibration device according to claim 1,
wherein the mount is constituted by a plurality of layers laminated on the substrate in a height direction of the first protrusion and the second protrusion, the plurality of layers comprise a first layer shared by both the first protrusion and the second protrusion, a pair of second layers laminated on the first layer and respectively forming the first protrusion and the second protrusion, and a third layer laminated on one of the pair of second layers forming the first protrusion so that the third layer also forms the first protrusion.

6. The vibration device according to claim 5,
wherein each of the plurality of layers is made of metal.

7. The vibration device according to claim 1,
wherein the mount is constituted by a plurality of layers laminated on the substrate in a height direction of the first protrusion and the second protrusion, the plurality of layers comprise a first layer shared by both the first protrusion and the second protrusion, and a second layer laminated on the first layer and forming the first protrusion.

8. The vibration device according to claim 7,
wherein each of the plurality of layers is made of metal.

9. The vibration device according to claim 1,
wherein the mount has a base on which the first protrusion and the second protrusion are formed, and one of the first protrusion and the second protrusion is integrally formed with the base.

10. The vibration device according to claim 1,
wherein the mount has a base on which the first protrusion and the second protrusion are formed, and the first protrusion and the second protrusion are both integrally formed with the base.

* * * * *